(12) United States Patent
Garroway et al.

(10) Patent No.: US 6,420,872 B1
(45) Date of Patent: Jul. 16, 2002

(54) PROBE FOR DETECTING A TRANSIENT MAGNETIC RESONANCE SIGNAL, WHEREIN THE RATIO OF THE Q OF THE PROBE TO THE Q OF THE RESONANCE SIGNAL IS RELATIVELY LARGE

(75) Inventors: Allen N. Garroway, Davidsonville; Joel B. Miller, Cheverly, both of MD (US); Bryan H. Suits, Boughton, MI (US); Richard L. Garwin, Scarsdale, NY (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/006,440

(22) Filed: Jan. 13, 1998

(51) Int. Cl.[7] .................................................. G01V 3/00
(52) U.S. Cl. ...................................... 324/322; 324/318

(58) Field of Search ................................. 324/300, 307, 324/309, 318, 319, 320, 321, 322

(56) References Cited

U.S. PATENT DOCUMENTS

| 4,633,181 A | * | 12/1986 | Murphy-Boesch et al. | . 324/322 |
| 4,691,164 A | * | 9/1987 | Haragashira | ................. 324/322 |
| 5,585,723 A | * | 12/1996 | Withers | ....................... 324/318 |

* cited by examiner

Primary Examiner—Edward Lefkowitz
Assistant Examiner—Tiffany A. Fetzner
(74) Attorney, Agent, or Firm—John J. Karesek; Jane Barrow

(57) ABSTRACT

An apparatus which includes a probe for detecting a resonance signal induced in a sample. The probe and the resonance signal each have a respective, corresponding Q, and the ratio, Q', of the Q of the probe to the Q of the resonance signal is relatively large. Preferably, Q' is greater than, or equal to, 1.

18 Claims, 8 Drawing Sheets

$Q_{probe} > Q_{resonant\ signal}$

PROBE FOR DETECTING A TRANSIENT MAGNETIC RESONANCE SIGNAL, WHEREIN THE RATIO OF THE Q OF THE PROBE TO THE Q OF THE RESONANCE SIGNAL IS RELATIVELY LARGE

BACKGROUND OF THE INVENTION

1. Field of the Invention

The present invention relates to a probe for detecting a transient magnetic resonance signal induced in a sample, wherein the ratio of the Q of the probe to the Q of the resonance signal is relatively large, and preferably larger than 1.

2. Description of the Related Art

Magnetic resonance is useful to detect the presence of a specific substance in a sample. For example, generally, radio frequency (RF) radiation at a particular frequency will induce a magnetic resonance signal in a specific substance, but not in other substances. Therefore, the induced magnetic resonance signal can be detected to thereby indicate the presence of the specific substance.

It is common to detect a magnetic resonance signal by placing a sample to be measured in a tuned, electronically resonant tank circuit. Then, the response of the tank circuit to the electromotive force produced by nuclear or electronic spins in the sample is measured. With Nuclear Magnetic Resonance (NMR) and Nuclear Quadrupole Resonance (NQR), the sample is placed in or near an inductor. Parallel and/or series capacitance is added to make the circuit electrically resonant at the measurement frequency. One or more additional reactive impedances (inductors or capacitors) are typically added to adjust the resistive impedance at resonance to a particular value which optimizes the detection sensitivity.

FIG. 1 is a diagram illustrating an example of a conventional magnetic resonance apparatus. Referring now to FIG. 1, a transmitter 20 and a receiver 22 are connected to a probe 24 through a transmit/receive (T/R) switch 26. Probe 24 includes an inductor, such as a coil 28, forming part a resonant, tuned tank circuit with various other inductors L and capacitors C. To detect the presence of a target substance, T/R switch 26 connects transmitter 20 to probe 24 while disconnecting receiver 22 from probe 24. Then, transmitter 20 generates a pulse and supplies the pulse to probe 24. As an example, in NQR, the pulse is formed by an RF signal having a frequency corresponding to the resonance signal of the target substance which is intended to be detected. Probe 24 receives the pulse, which causes coil 28 to store (RF) energy.

If a sample (not illustrated) is appropriately placed near, or inside, coil 28, the stored RF energy will cause a corresponding RF magnetic field to irradiate the sample. If the sample includes the target substance, the RF magnetic field will induce a magnetic resonance signal in the target substance. For example, if the apparatus operates under the principles of NMR, then an appropriate NMR resonance signal will be induced. If the apparatus operates under the principles of NQR, then an appropriate NQR resonance signal will be induced.

After the sample is irradiated with the RF magnetic field, T/R switch 26 connects receiver 22 to probe 24 while disconnecting transmitter 20 from probe 24. Coil 28 then detects the resonance induced in the target substance, and probe 24 produces a corresponding output signal. The output signal of probe 24 is received and analyzed by receiver 22, to confirm the presence of the target substance in the sample.

FIG. 1 is only one example of a magnetic resonance apparatus. For example, FIG. 1 illustrates T/R switch 26 to connect transmitter 20 and receiver 22 to the same probe 24. However, instead, a transmitter and receiver can each have a separate, dedicated probe together with a switch or gate for protecting the receiver while the transmitter is ON.

A probe and a resonance signal induced in a sample each have a corresponding, respective quality factor, Q. The Q of the probe is actually the Q of the tuned tank circuit of the probe. Therefore, the "Q of the probe" and the "Q of the tuned tank circuit of the probe" are used interchangeably herein. Further, the bandwidth of the probe is defined as f/Q, where f is the resonant frequency of the probe.

Magnetic resonance measurements are largely concerned with the measurement of the spectrum of the nuclear (or electronic) spins in the sample. Therefore, conventionally, the bandwidth of the probe is greater than the bandwidth of the detected magnetic resonance signal so that the entire magnetic resonance signal falls within the bandwidth of the probe. These relative bandwidths of the probe and the magnetic resonance signal allow the tuned tank circuit of the probe to faithfully follow (that is, reproduce) the magnetic resonance signal.

To achieve these relative bandwidths, the Q of the probe must be small enough so that the bandwidth (f/Q) of the probe is larger than the bandwidth of the magnetic resonance signal. In this case, as described above, the probe can follow the magnetic resonance signal.

Moreover, it is well-known that when the Q of the probe is small enough to follow the magnetic resonance signal, the SNR of the apparatus increases in proportion to the square root of Q. Therefore, generally, it is desirable to increase the Q of the probe as high as possible, while still allowing the probe to follow the magnetic resonance signal.

To summarize, the Q of probe should be as high as possible to increase the SNR of the apparatus, but low enough to provide a probe bandwidth (f/Q) which is greater than the bandwidth of the magnetic resonance signal. In most magnetic resonance applications, such as in NQR, Q' is conventionally less than 0.3, and is typically much less than 0.3, where Q' is defined as the ratio of the Q of the probe to the Q of the magnetic resonance signal. Here, the Q of the signal is defined as the ratio of the signal's center frequency to its bandwidth. Increasing Q' above 0.3 reduces the bandwidth of the probe with respect to the bandwidth of the magnetic resonance signal so that the probe cannot accurately follow the magnetic resonance signal. If the probe cannot accurately follow the magnetic resonance signal, it is conventionally believed that the SNR will be reduced. Therefore, in most magnetic resonance applications, such as in NQR, Q' of 0.3 conventionally places a limit on the Q of the probe with respect to the Q of the magnetic resonance signal.

There are some cases where the condition of Q'=1 is approached. These occur in magnetic resonance imaging with very large field gradients, and in some instances of wideline magnetic resonance spectroscopy. In these cases, the intrinsic magnetic resonance signal linewidth is greater than the probe bandwidth. However, since the probe is also used to excite the magnetic resonance signal, the Q of the signal is greater than or equal to the Q of the detector, leading to Q'<=1.

Therefore, the SNR of a conventional apparatus for detecting magnetic resonance signals will be limited by the allowed value of Q'. This limitation on the SNR may not be acceptable for detecting magnetic resonance signals in certain situations.

SUMMARY OF THE INVENTION

Accordingly, it is an object of the present invention to provide an apparatus which detects a magnetic resonance signal, and has an improved detection ability and SNR over conventional apparatuses.

Additional objects and advantages of the invention will be set forth in part in the description which follows, and, in part, will be obvious from the description, or may be learned by practice of the invention.

The foregoing objects of the present invention are achieved by providing an NQR apparatus which includes a probe for detecting an NQR signal induced in a sample. The probe and the NQR signal each have a respective, corresponding Q, and the ratio, Q', of the Q of the probe to the Q of the NQR signal is greater than, or equal to, 0.3.

Objects of the present invention are also achieved by providing an apparatus which includes a probe for detecting a resonance signal induced in a sample. The probe and the resonance signal each have a respective, corresponding Q, and the ratio, Q', of the Q of the probe to the Q of the resonance signal is greater than 1.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
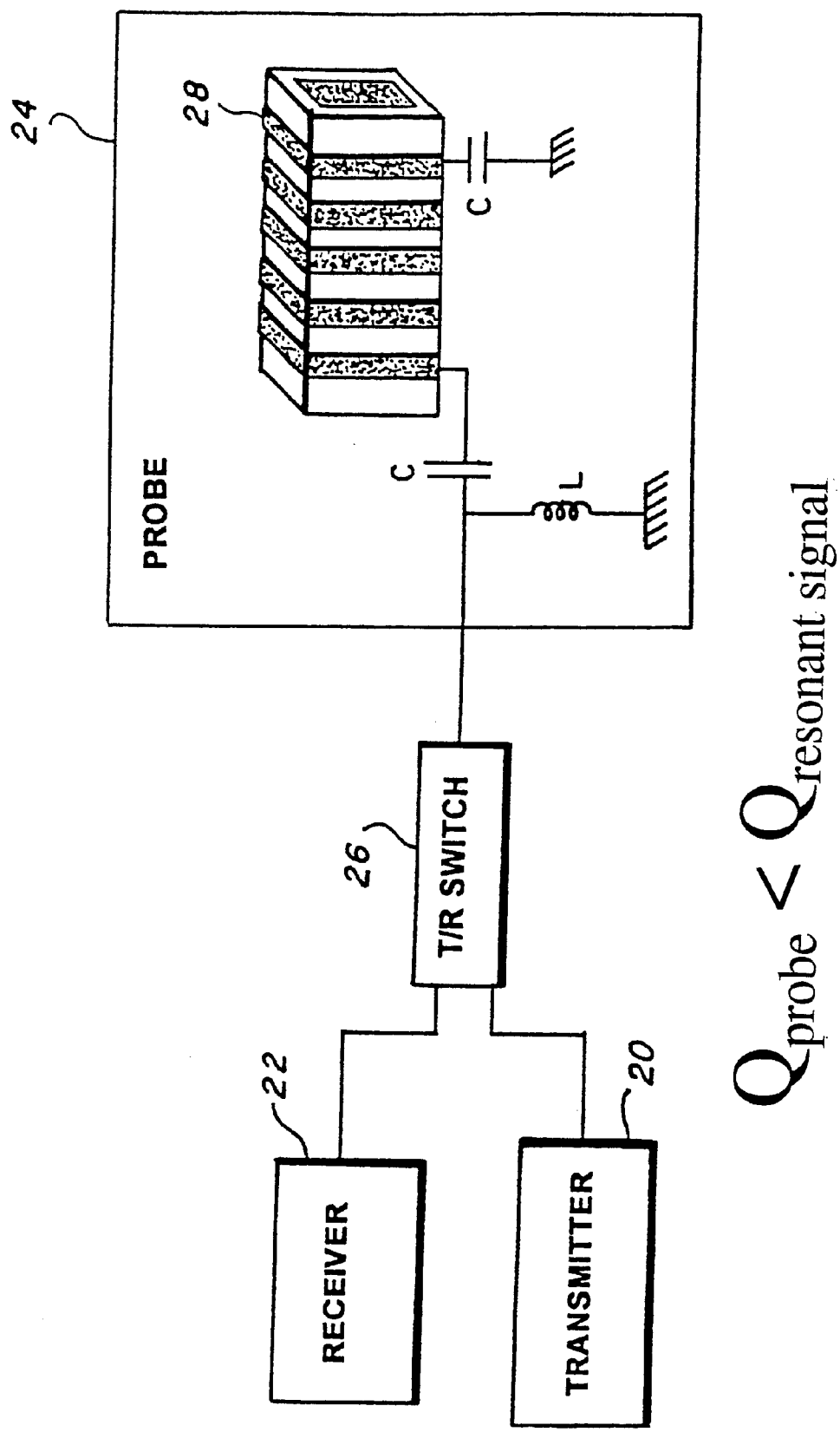
FIG. 1 is a diagram illustrating an example of a conventional magnetic resonance apparatus.

Reference will now be made in detail to the present preferred embodiments of the present invention, examples of which are illustrated in the accompanying drawings, wherein like reference numerals refer to like elements throughout.

Figure 2:
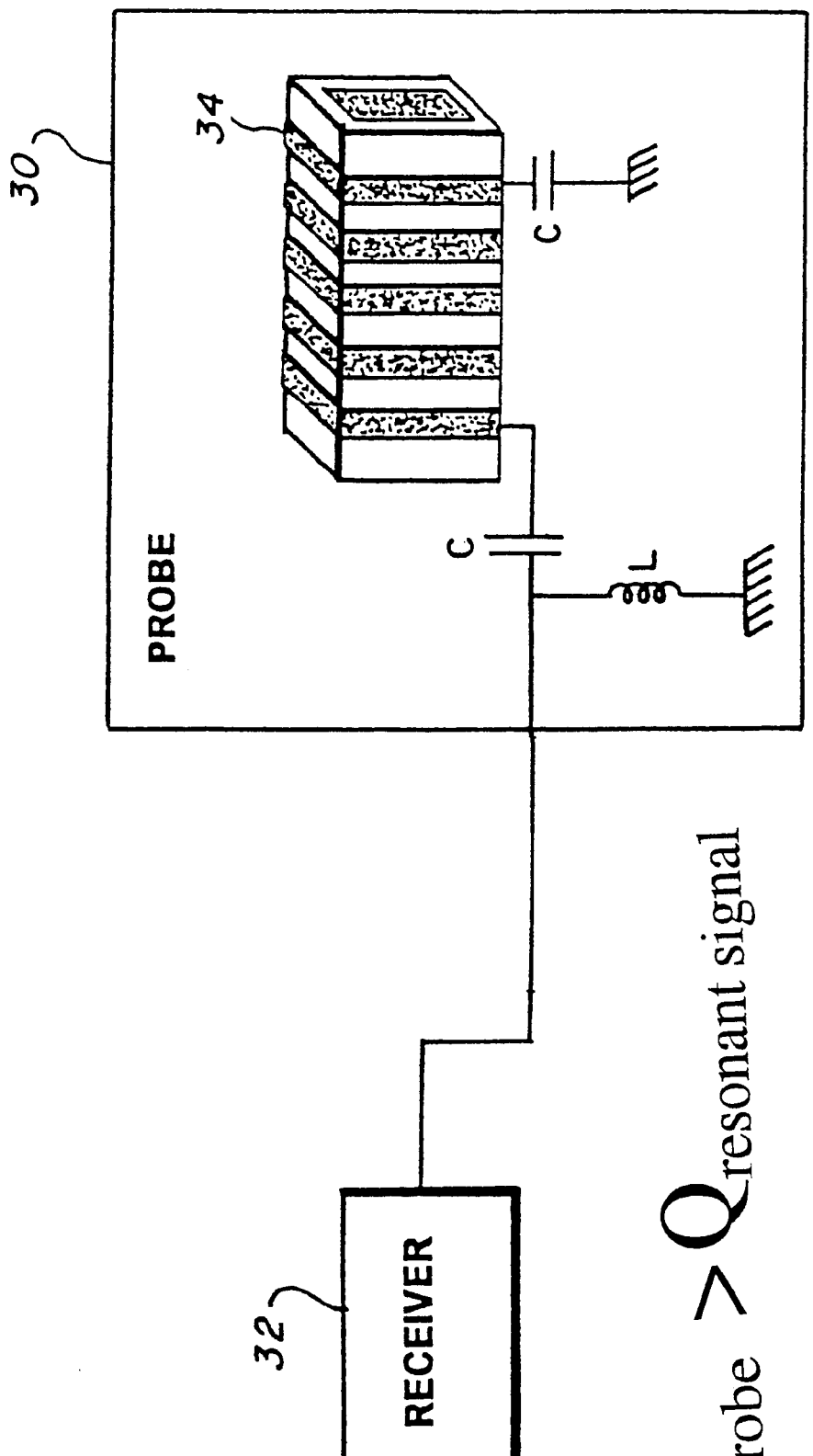
FIG. 2 is a diagram illustrating an apparatus for detecting a magnetic resonance signal induced in a sample, according to an embodiment of the present invention.

FIG. 2 is a diagram illustrating an apparatus for detecting a magnetic resonance signal induced in a sample, according to an embodiment of the present invention.

Referring now to FIG. 2, a probe 30 is connected to a receiver 32. Probe 30 includes an inductor, such as a coil 34, forming part a resonant, tuned tank circuit with various other inductors L and capacitors C. Probe 30 in FIG. 2 appears similar to probe 24 in FIG. 1. However, the values of coil 34 and/or the various other inductors L and capacitors C are chosen to provide probe 30 with a relatively high Q so that the bandwidth of probe 30 is preferably less than the bandwidth of a magnetic resonance signal to be detected by probe 30. This can be contrasted to a conventional apparatus in which bandwidth of a probe is greater than the bandwidth of the magnetic resonance signal.

Combined with post-processing in receiver 32 of the actual signal detected by probe 30, as will be seen in greater detail below, embodiments of the present invention provide a much improved SNR as compared to conventional apparatuses.

A magnetic resonance signal and the tuned tank circuit of a probe are similar in that both will require some characteristic time to return to equilibrium after being perturbed. More specifically, the probe will experience a number of oscillations, or "ringing", during a characteristic time, which will eventually return to equilibrium. Generally, according to the embodiments of the present invention, a probe includes a tank circuit having a Q large enough so that the magnetic resonance signal decays much faster than does ringing in the tank circuit.

Generally, the quality factor Q of the tuned tank circuit of a probe is the number of oscillations which occur during the characteristic time. As previously described, a larger Q corresponds to a smaller detection bandwidth since the bandwidth of the probe is defined as f/Q, where f is the resonant frequency of the probe.

Figure 3:
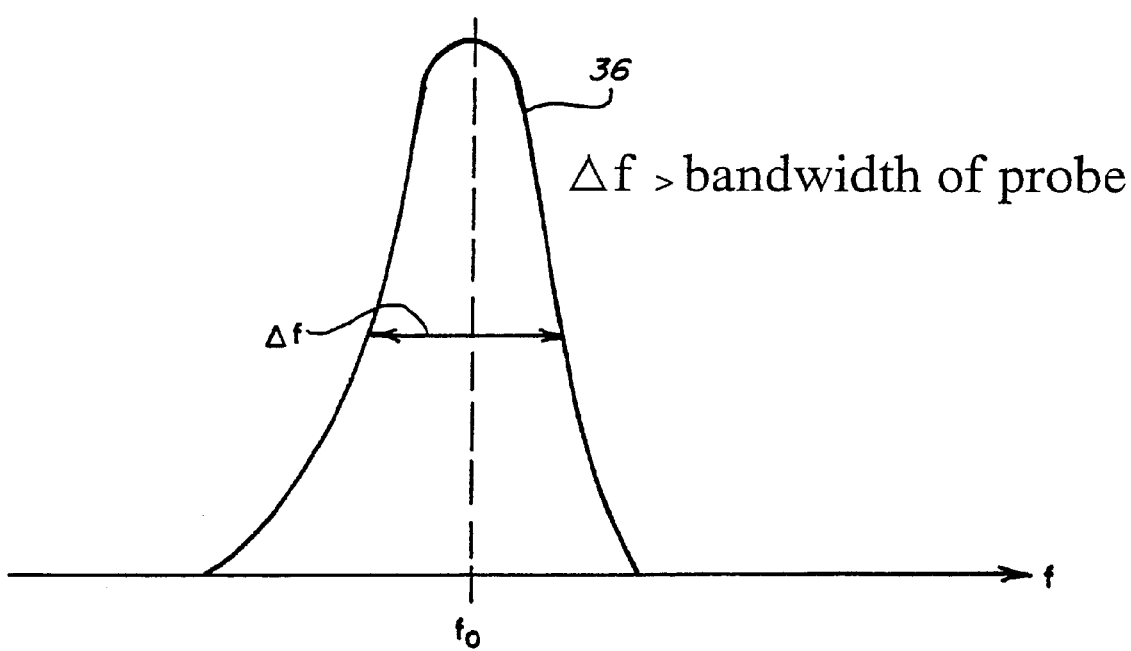
FIG. 3 is a diagram illustrating a resonance signal in the frequency domain.

As is well-known, a magnetic resonance signal also has a corresponding Q. For example, FIG. 3 is a diagram illustrating a resonance signal in the frequency domain. A corresponding diagram could easily be drawn in the time domain. Referring now to FIG. 3, a resonance signal 36 has a corresponding center frequency $f_0$ and a corresponding bandwidth $\Delta f$. Generally, for the resonance signal:

$$Q = f_0/\Delta f = \pi f_0 \Delta t,$$

where $\Delta t$ equals the amount of time in the time domain for the magnetic resonance signal to decay to $e^{-1}$ from the maximum height of the signal. Generally, $\Delta f$ corresponds to the full width at half height (FWHH) of the magnetic resonance signal.

Magnetic resonance signals can have many different shapes and are not intended to be limited to that shown in FIG. 3. Moreover, the concept of a "Q" for a magnetic resonance signal is well-known and easily determinable for a particular signal by a person of skill in the art. For example, as noted above, the Q of magnetic resonance signals having different shapes can be determined from the equation $Q = f_0/\Delta f = \pi f_0 \Delta t$.

Q' is the ratio of the Q of the probe to the Q of the resonance signal. More specifically:

$$Q' = Q(\text{probe})/Q(\text{signal}) = \text{bandwidth}(\text{signal})/\text{bandwidth}(\text{probe})$$

According to embodiments of the present invention, Q'>1. Therefore, the Q of the probe is greater than the Q of the magnetic resonance signal. In this case, the apparatus can be considered in the "super-Q" limit. The inventors of the present invention have determined that in the super-Q limit, the signal-to-noise ratio (SNR) increases in proportion to the square root of the Q of the probe. This is substantially different than the conventional belief that increasing Q' above 0.3 will reduce SNR.

Figure 9:
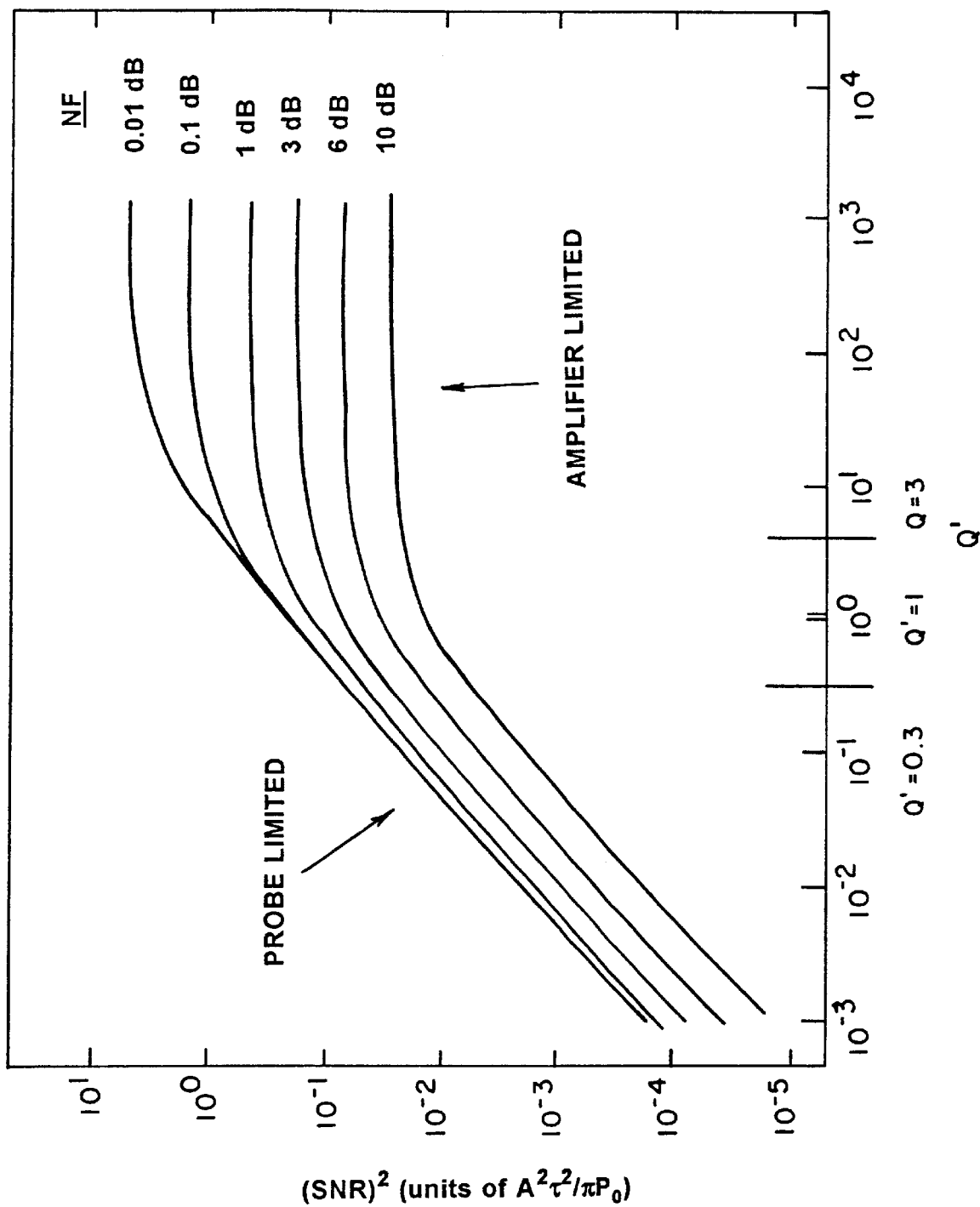
FIG. 9 is a diagram illustrating changes in SNR for a variety of values of noise figure (NF) of the amplifier, according to an embodiment of the present invention.

Generally, according to embodiments of the present invention, there is no limitation on the absolute size of Q', although the SNR will ultimately be limited by preamplifier noise, as in FIG. 9. However, many magnetic resonance signals are very narrow band, and the Q of the signal may therefore be high. As a result, the Q of the probe may need to be very high to satisfy the super-Q requirement.

When the Q of the probe is very large, both the thermal noise and the magnetic resonance signal behave as broadband signals to the tank circuit of the probe, so that a similar response is observed for both the thermal noise and the magnetic resonance signal. In particular, if $P(\omega)$ is the power density of the thermal noise from the tank circuit (in $V^2/Hz$) and $S(\omega)$ is the frequency spectrum of the magnetic resonance signal to be detected (in $V/Hz^{1/2}$), then $|S(\omega)|^2$ is proportional to $P(\omega)$. This fact can be beneficially used for the detection of a known signal, with unknown magnitude, in noise.

With an appropriate filter (such as a noise whitening filter followed by an optimized linear filter, as disclosed in McDonough and Whalen, *Detection of Signals in Noise*, 2nd Ed., Academic Press, 1995, which is incorporated herein by reference), using a known signal shape, applied to the measured signal, the signal-to-noise ratio, SNR, is given by $$(SNR)^2 = \frac{1}{2\pi} \int_{-\infty}^{+\infty} \frac{|S(\omega)|^2 d\omega}{P(\omega)}.$$

In general, $P(\omega)$ includes noise from the tank circuit plus noise added during amplification. However, when the Q of the tank circuit approaches infinity and a perfect amplifier is used, the SNR also goes to infinity, independent of the temperature of the detection circuit. While that limit would not be achieved in practice, this shows that the thermal noise from the detection circuit does not, by itself, provide a fundamental limit to the SNR.

Therefore, according to embodiments of the present invention, the bandwidth of the probe is smaller than that of the magnetic resonance signal to be detected. In this case, as described in more detail below, the detection sensitivity continues to increase with increasing Q of the probe. In addition, the detection sensitivity is not inherently limited by the thermal noise from the detection circuitry, but by noise added later in the system.

Therefore, according to embodiments of the present invention, Q' is greater than 1, so that the bandwidth of the probe is less than the bandwidth of the resonance signal. As a result, the probe typically will not be able to follow or faithfully reproduce the magnetic resonance signal. However, a primary objective the present invention is to detect, not follow, the magnetic resonance signal.

Therefore, embodiments of the present invention operate in sharp contrast to conventional techniques. More specifically, as previously described, it was conventionally believed that Q' must be less than 0.3 in most application, so that the bandwidth of the probe is sufficiently greater than the bandwidth of the magnetic resonance signal to thereby allow the probe to accurately follow the magnetic resonance signal. Conventionally, it was believed that increasing Q' beyond 0.3 would decrease the SNR since the probe cannot accurately follow the magnetic resonance signal. The origin of this difference between conventional techniques and embodiments of the present invention arises in part since the conventional techniques are largely concerned with following the magnetic resonance signal to faithfully reproduce the signal. By contrast, embodiments of the present invention are largely concerned with detecting, and not faithfully reproducing, the magnetic resonance signal.

As Q' is increased beyond 1, the shape of the detected signal will change. More specifically, as Q' is increased (by, for example, increasing the Q of the probe), the amplitude of the detected signal will decrease, while the duration of the detected signal will increase.

Figure 4A:
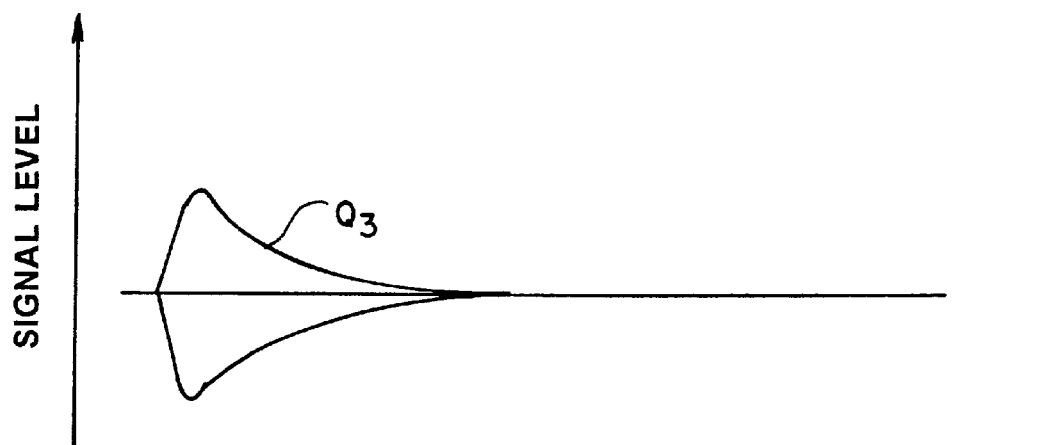
FIGS. 4(A), 4(B) and 4(C) are graphs illustrating signals in the time domain detected by a probe, where the Q of the probe equals $Q_1$, $Q_2$ and $Q_3$, respectively, with $Q_1 < Q_2 < Q_3$, according to an embodiment of the present invention.
Figure 4B:
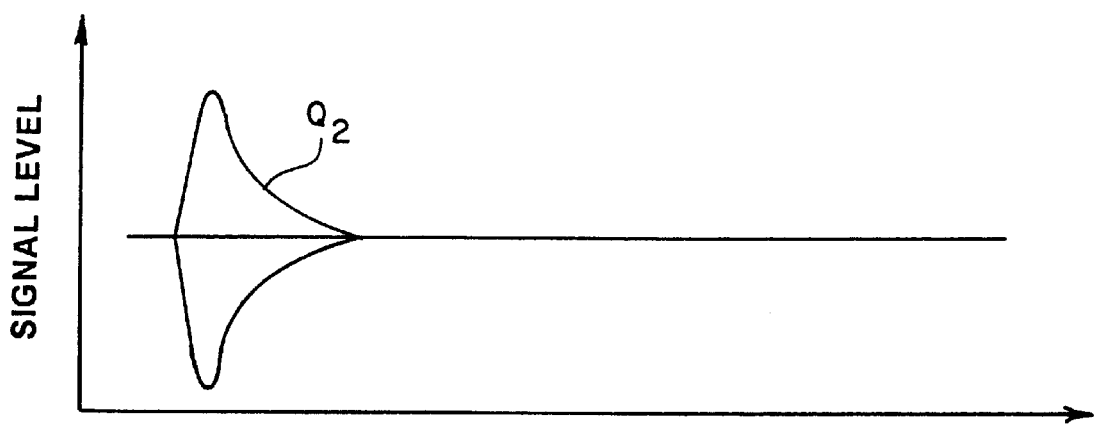
Figure 4C:
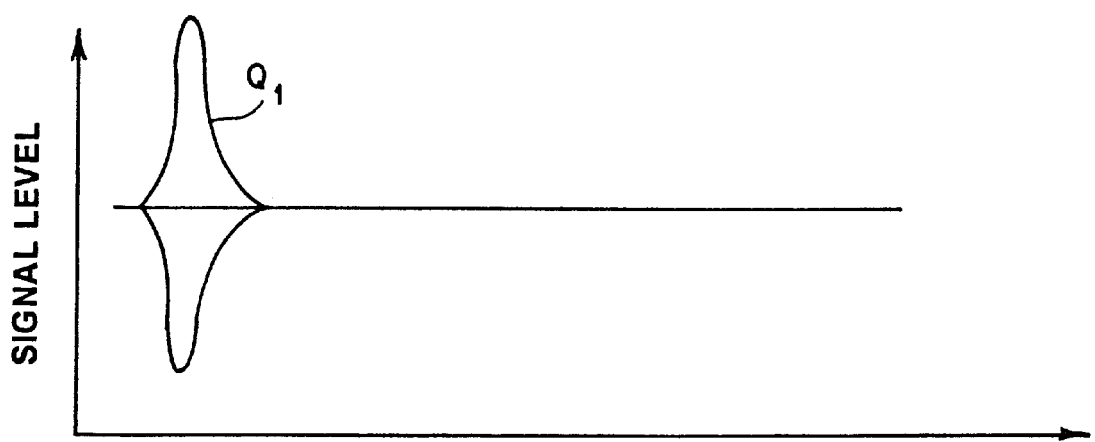

FIGS. 4(A), 4(B) and 4(C) are graphs illustrating detected signals where the Q of the probe equals $Q_1$, $Q_2$ and $Q_3$, respectively, with $Q_1<Q_2<Q_3$, according to an embodiment of the present invention. As illustrated by FIGS. 4(A), 4(B) and 4(C), as the Q of the probe increases, the amplitude of the detected signal decreases and the duration of the detected signal increases.

Therefore, as Q' increases, receiver 32 (see FIG. 2) can easily detect the resonance signal by integrating the signal as detected by probe 30 (see FIG. 2). Alternatively, when $Q'>>1$, such as when $Q' \geq 10$, receiver 32 can detect the resonance signal by detecting a step increase over time in the power level of the signal as detected by probe 30.

Therefore, according to embodiments of the present invention, Q' is preferably greater than 1 in a magnetic resonance apparatus. This can be compared to a conventional magnetic resonance apparatus, where Q' is less than 1.

Moreover, as described above, some magnetic resonance applications, such as NQR, conventionally have Q'<0.3. In these application, Q' is typically <<0.3. Conventionally, it is believed that increasing Q' above 0.3 will reduce the SNR. However, as noted above, the present invention recognizes that Q' can be further increased to actually improve SNR and thereby improve detectability of the signal. Therefore, in these magnetic resonance applications, such as in NQR, the present invention recognizes that Q' can be greater than 0.3.

Theory

The following theory describes the underlying principles of embodiments of the present invention.

Model Circuit

Figure 5:
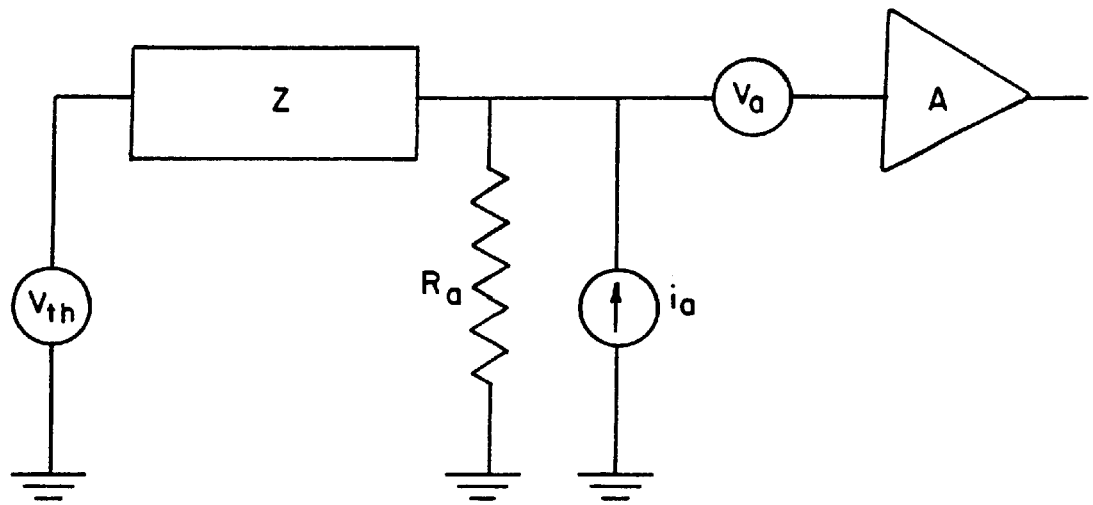
FIG. 5 is a diagram illustrating a noise model circuit of the probe and preamplifier, according to an embodiment of the present invention.

FIG. 5 is a diagram illustrating a model circuit of a probe and preamplifier, according to an embodiment of the present invention. More specifically, FIG. 5 illustrates a model circuit of an NMR or NQR probe, such as probe 30 in FIG. 2.

Referring now to FIG. 5, $v_{th}$ and Z are the Therein equivalent voltage and impedance, respectively, of the probe. The terms $i_a$ and $v_a$ represent current and voltage noise sources, respectively, used to model the noise from the preamplifier, and A and $R_a$ are the gain and the input impedance of the amplifier. The model resistor $R_a$ is noiseless. The voltage in the probe, $v_{th}$, includes both signal and thermal noise. However, the noise will be treated separately. It is assumed that the noise from the amplifier and the noise from the probe are uncorrelated. The probe is assumed to be at a temperature T and the observed thermal noise will depend on the real part of Z. Straightforward analysis shows that the noise power density (in units of $V^2/Hz$) at the input of the amplifier, $P(\omega)$, is given by the following Equation 1.

$$P(\omega) = v_a^2 + i_a^2 \left| \frac{ZR_a}{Z+R_a} \right|^2 + 4kTRe(Z) \left| \frac{R_a}{Z+R_a} \right|^2.$$

In order to obtain an expression for the signal, and explicit expressions for Z, details of the particular probe circuit need to be considered.

Figure 6:
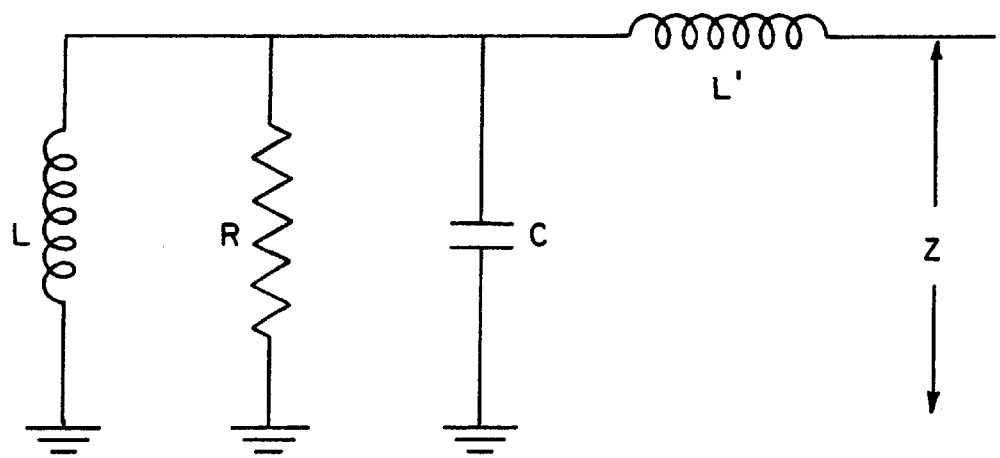
FIG. 6 is a diagram illustrating a parallel-tuned detection circuit, according to an embodiment of the present invention.

For example, FIG. 6 is a diagram illustrating a parallel-tuned detection circuit, according to an embodiment of the present invention. A similar analysis with similar results can be carried out for a series tuned detection circuit. Referring now to FIG. 6, a sample is contained in L. The inductor L' is used for impedance matching. Losses in L' and in the cables connecting the detection circuit are considered small compared to $R_a$, and the noise associated with those losses is included in the amplifier noise. For longer cable lengths, the impedance transformation due to the cable also needs to be considered. The values of C and L' are adjusted as needed to make the resonant circuit have a real impedance, $Z=R_0$ ($R_0 \geq R$), at a particular frequency, $\omega_0$. This is achieved by choosing values of C and L' according to the following Equations 2 and 3, respectively.

$$C = \frac{1}{\omega_0^2 L}\left(1 + \frac{1}{Q}\sqrt{\frac{R-R_0}{R_0}}\right)$$

$$= \frac{1}{\omega_0^2 L}\left(1 + \frac{1}{Q}\sqrt{\frac{\omega_0 L Q - R_0}{R_0}}\right)$$

$$L' = \frac{1}{\omega_0}\sqrt{R_0(R-R_0)}$$

$$= \frac{1}{\omega_0}\sqrt{R_0(\omega_0 L Q - R_0)}$$

where $Q=R/\omega_0 L$. A similar expression is obtained if a capacitance, C', is used for impedance matching instead of an inductance. Using Equations 2 and 3, the following Equation 4 is found.

$$Z = i\omega L R^2 \left[\frac{\omega_0^2 LC - 1}{[R(\omega_0^2 LC - 1)]^2 + \omega_0^2 L^2} - \frac{\omega^2 LC - 1}{[R(\omega^2 LC - 1)]^2 + \omega^2 L^2}\right] +$$

$$\frac{\omega^2 L^2 R}{[R(\omega^2 LC - 1)]^2 + \omega^2 L^2}$$

When $\omega$ is near $\omega_0$, Equation 4 can be approximated quite well by the simpler Equation 5, as follows.

$$Z = i\omega L \left[\frac{\omega_0^2 LC - 1}{[(\omega_0^2 LC - 1)]^2 + \frac{1}{Q^2}} - \frac{\omega^2 LC - 1}{[(\omega^2 LC - 1)]^2 + \frac{1}{Q^2}}\right] +$$

$$\frac{R/Q^2}{[(\omega^2 LC - 1)]^2 + \frac{1}{Q^2}}$$

The nuclear magnetization will induce an electromotive force (EMF) in L due to the time changing magnetic flux, $\phi(t)$. In the frequency domain, this gives rise to a Therein equivalent voltage source for the desired signal, as follows:

$$v_{th}(\omega) = i\omega\phi(\omega)\frac{1}{(1-\omega^2 LC) - i\omega L/R}$$

$$\approx i\omega\phi(\omega)\frac{1}{(1-\omega^2 LC) - \frac{i}{Q}}.$$

So the signal, $S(\omega)$, at the input of the amplifier will be as follows:

$$S(\omega) = v_{th}(\omega)\frac{R_a}{Z(\omega) + R_a}.$$

When $Q\omega_0 L >> R_0$, and with the assumption $R_a \leq \omega_0 L$, Equation 7 can be approximated by the following Equation 8.

$$S(\omega) = i\omega\phi(\omega)\left[\frac{-i(R_a(QR_0\omega_0 L))^{-1/2}}{(\omega^2-\omega_0^2)LC - \frac{i}{Q}\left(\frac{R_0+R_A}{R_0}\right)}\right]\left[\frac{\omega^2 LC - 1 - i/Q}{\omega^2 LC - 1 + i/Q}\right].$$

The approximation is valid when $\omega \approx \omega_0$; $S(-\omega)=S^*(\omega)$ is used when $\omega \approx -\omega_0$.

The real part of the impedance is found in the following Equation 9.

$$Re(Z) = \left|\frac{\sqrt{R}/Q}{(1-\omega^2 LC) + \frac{i}{Q}}\right|^2$$

Neglecting the noise from the amplifier for the moment, it is then found that the noise power density from the tuned probe is given by the following Equation 10.

$$P_0(\omega) = \frac{4kT\omega_0 L}{Q}\left|\frac{S(\omega)}{i\omega\phi(\omega)}\right|^2$$

and $P_0(\omega_0)=4$ kT $R_0[R_a^2/(R_a+R_0)^2]$ as expected. When the magnetic resonance signal is narrow compared to the probe bandwidth, this noise is, for all practical purposes, white noise.

As will be seen below, Equation 10 is the important result for super-Q detection as it shows the direct relationship between the amplitude of the thermal noise from the probe and the amplitude of the received signal.

If $\phi(\omega)$ is broadband ($\phi(\omega) \approx$ constant), the signal from the coil in the time domain, s(t), will be an exponential decay with an initial amplitude proportional to $Q^{-\frac{1}{2}}$ and with a decay time constant determined by the "loaded Q", $Q_L=R_0 Q/(R_0+R_a)$. This result is familiar to magnetic resonance spectroscopists and is often used to describe the ring-down of a magnetic resonance probe after an applied rf pulse. In traditional magnetic resonance measurements, the signal from the coil follows the excitation (i.e. $S(\omega)$ i$\omega\phi$ ($\omega$)) and no distinction is usually made between the coil response and the magnetic resonance signal itself. However, in the super-Q limit, the coil response does not follow the magnetic resonance signal. Unless specifically qualified, the word "signal" is used in what follows to refer to the measured response of the coil due to excitation by the nuclear magnetization.

Equation 8 appears to suggest a net loss in SNR for super-Q detection since only the nuclear signals within a narrow bandwidth around $\omega_0$ will be detected. However, as show below, there may be a substantial gain. To some extent, such gain can be compared to an analogous pulsed magnetic resonance measurement, but employing the nuclei as the detector of pulsed rf. In that case, the best signal-to-noise ratio is achieved for nuclei with long relaxation times ($T_2$ in this case) compared to the rf pulse length, even though the nuclei only "see" the component of the pulsed rf at their resonant frequency.

Optimized Filter

Typically the SNR is determined by comparing the signal height (in either the frequency or time domain) to the root mean square (RMS) noise. The more general question is "how can the measured data points be combined in the best possible way to determine the amount of signal present and how does that compare to the noise?" Conventional magnetic resonance methods will use band-pass filters, Fourier transforms, apodization, and similar techniques to help make the desired signal stand out against the noise. It is worth pointing out that none of those techniques increase the information content of the measured signal, and in fact may decrease it.

In order to make a fair comparison between the SNR obtainable in different circumstances, a linear optimized filter can be used. SNR here is a measure of the ability to determine the amplitude of a known signal in noise, using an appropriate combination of all the data acquired. Hence this analysis is not directly applicable for the measurement of unknown magnetic resonance spectra.

As is well known, the SNR in the presence of stationary white noise can be maximized at a particular time after the signal, $t_m$, by applying a matched filter, $H(\omega)$, having characteristics as indicated by the following Equation 11.

$$H(\omega)=S^*(\omega)e^{-i\omega t_m} \qquad \text{Equation 11:}$$

$S^*(\omega)$ is the Fourier transform of the known desired signal. When the noise is not white, the matched filter can be preceded by a whitening filter, $H'(\omega)$, satisfying the following Equation 12.

$$|H'(\omega)|^2 P(\omega)=|C|^2 \qquad \text{Equation 12:}$$

where C is any constant and $P(\omega)$ is the noise power density. The time $t_m$ is important for the design of a physically realizable filter and expresses the fact that for a physically realizable filter, the maximum SNR will occur at a time after the excitation has occurred. If the filter is implemented using numerical post-processing, $t_m$ can be set equal to 0.

With (non-causal) post processing, $H'(\omega)$ can be chosen to be real, C=1, and $t_m$=0 for convenience. The signal after the filters is given by the following Equation 13.

$$s_0(t) = \frac{1}{2\pi}\int_{-\infty}^{+\infty} S(\omega)H'(\omega)H(\omega)e^{i\omega t}\,d\omega$$

$$= \frac{1}{2\pi}\int_{-\infty}^{+\infty} CS(\omega)P(\omega)^{-1/2}H(\omega)e^{i\omega t}\,d\omega$$

The noise is given by the following Equation 14.

$$\langle n_0^2(t)\rangle = \frac{1}{2\pi}\int_{-\infty}^{+\infty} |C|^2 |H(\omega)|^2\,d\omega$$

The derivation of the matched filter using the Schwartz inequality proceeds as in the case of white noise to give an optimized filter according to the following Equation 15.

$$H(\omega)=S^*(\omega)P(\omega)^{-1/2}e^{-i\omega t_m} \qquad \text{Equation 15:}$$

An optimized SNR at a time $t_m$ given by the following Equation 16.

$$(SNR)^2 = \frac{s_0^2(t_m)}{\langle n_0^2(t)\rangle} = \frac{1}{2\pi}\int_{-\infty}^{+\infty} \frac{|S(\omega)|^2}{P(\omega)}\,d\omega.$$

Since no initial assumptions were made regarding $H(\omega)$, Equation 16 gives the best SNR obtainable with a linear filter. This filter can be implemented in hardware using standard rf filters and/or during post processing of acquired data. Since the filter is likely to be realized only approximately using hardware, and it is undesirable to modify the hardware for each new circumstance, post processing will generally be more convenient.

In the super-Q limit, Q'>>1, the excitation from the nuclei and the noise from the probe, referenced to the coil, L, are both broadband and enter the circuit at the same point. If an ideal amplifier with a noise figure (NF) of 0 dB is used, then $P(\omega) \propto |S(\omega)|^2$. That is, the SNR is independent of frequency. Hence, by averaging together all the frequency components with appropriate weights, the combined SNR tends to infinity with increasing Q' even though the detection coil is at a finite temperature. In this limit, the amplitude of thermal noise from the detection system is not, by itself, an inherent limit to signal detection. In practice, the finite duration of the excitation (making the bandwidth of $S(\omega)$ less than that of $P(\omega)$) and the amplifier noise (which causes SNR to decrease with decreasing $|S(\omega)|$, rather than remaining constant) conspire to keep SNR finite.

Detectability

First, the essence of super-Q detection is illustrated by considering the case where amplifier noise is negligible.

Figure 7:
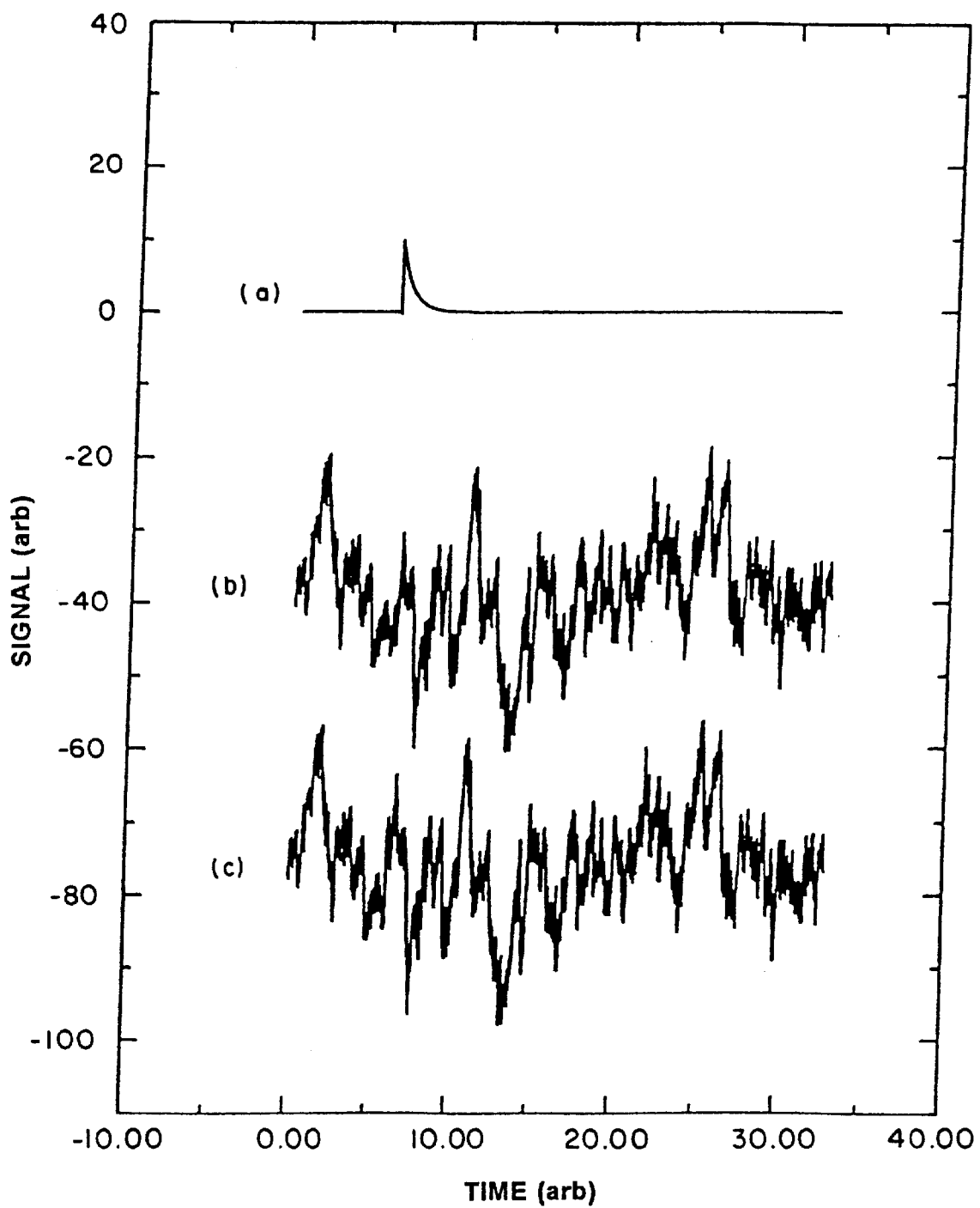
FIGS. 7, 8(A), 8(B), and 8(C) are diagrams illustrating possible measurements of a signal detected by a probe, according to an embodiment of the present invention.

FIG. 7 is a diagram illustrating three possible measurements, simulated numerically, of a signal detected by a probe, according to an embodiment of the present invention. Referring now to FIG. 7, (a) indicates the Fourier transform of a (complex) Lorentzian lineshape and represents the envelope of the tuned coil response to a short excitation in the absence of noise. (b) indicates the Fourier transform of the same Lorentzian lineshape, though with ten (10) times greater amplitude and with the phase of each frequency component randomized. Moreover, (b) indicates the envelope of thermal noise from the tuned coil. Hence $|S(\omega)|^2$ for each has the same shape. The data in the Fourier transform indicated by (b), the desired signal, is reduced by 20 dB compared to the noise. (c) indicates the sum of the data in (a) and (b). If SNR is defined in the time domain using the peak signal height compared to the rms noise, then clearly SNR<1. However, because the thermal noise from the tuned circuit is not white, this signal is easily detected with SNR>10, as is illustrated in FIGS. 8(A), 8(B), and 8(C), by looking for a step increase in the signal.

More specifically, FIGS. 8(A), 8(B), and 8(C) are a set of diagrams illustrating three possible measurements, simulated numerically, of a signal detected by a probe, according to an embodiment of the present invention. FIGS. 8(A), 8(B), and 8(C) contain the same data as does FIG. 7, except on an expanded time scale. Clearly the desired detection scheme, and the resulting definition of SNR, might be improved if one looks for a rapid rise, or step increase, of the signal over a time comparable to that of the excitation. The rapid rise of the signal compared to what is seen in the noise occurs due to the correlations between the phases of the frequency components of the signal, and is not due to the correlations in their amplitudes. The probability that such an alignment of the phases would occur by accident is very small. The probability that it would occur in just the right way so that an apparent signal shows up just at the right time is even smaller.

Figure 8:
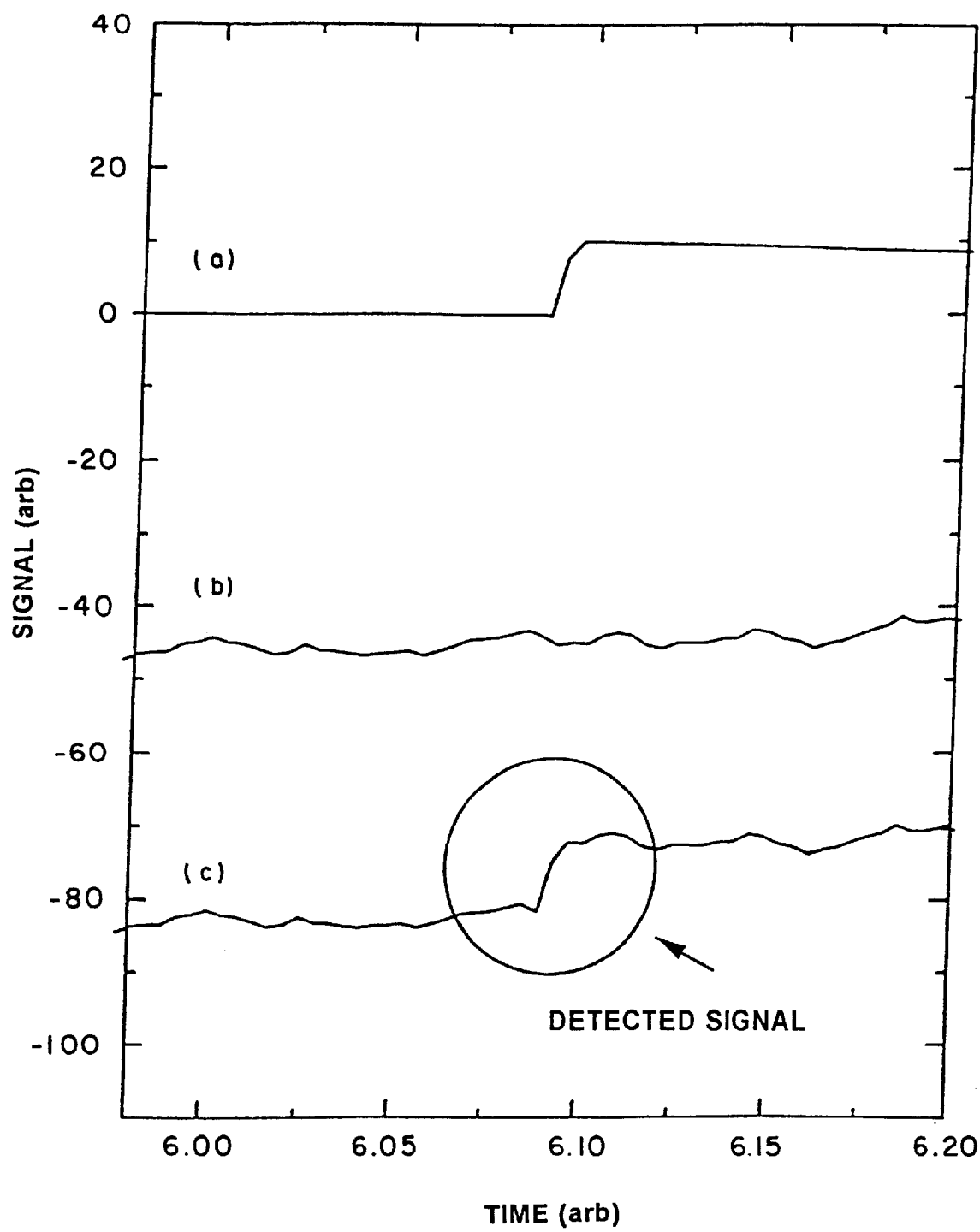

The weighting of the measured data to bring out this rapid change would correspond to a high pass filter. Recognizing that the data in FIGS. 7 and 8 are the envelopes which modulate a carrier signal at $\omega_0$, it is seen that the high pass filter corresponds to a notch filter with a notch at $\omega_0$. Applying a notch filter at the signal frequency in order to improve the SNR may, at first, seem counterintuitive, but can be better appreciated by the following argument.

An estimate of the SNR can be obtained by considering an experiment which measures the difference between two measured data points, one just before the excitation is expected and one just after. If the excitation starts just after time t and is finished at a time t+τ, the SNR for this crude measurement scheme will be given by the following Equation 17.

$$(SNR)^2 = \left\langle \left(\frac{s(t+\tau)-s(t)}{n(t+\tau)-n(t)}\right)^2 \right\rangle$$

$$= \frac{s^2(t+\tau)}{2\langle n^2(0)\rangle\left(1 - \frac{\langle n(\tau)n(0)\rangle}{\langle n^2(0)\rangle}\right)}$$

In the absence of amplifier noise, the following Equation 18 applies.

$$(SNR)^2 = \frac{s^2(t+\tau)}{2\langle n^2(0)\rangle(1 - e^{-\tau\pi f/Q_L})}$$

Since $s^2(t+\tau)$ $1/Q_L$ and $\langle n^2(0)\rangle$ $1/Q_L$, then in the super-Q limit, SNR $Q_L^{1/2}$. Hence we have shown in this example that SNR continues to increase in the super-Q regime, as $(Q')^{1/2}$.

(In the above example, it was assumed that the mean noise was already well-characterized. However, an alternative way of detecting the signal in this regime is by a method of "double gating." That is, the mean detected amplitude before the pulse is applied should be measured and stored, and subtracted from the mean detected amplitude after the pulse. The duration over which the mean is to be taken is the expected duration of a signal.)

Now consider super-Q detection for the case where the amplifier noise dominates the signal. For this illustration, the amplifier is modeled using (broadband) white noise. Since the noise at t+τ is uncorrelated with the noise at t, the two point detection scheme above gives $(SNR)^2 = s(t+\tau)^2/2\langle n^2(0)\rangle$ and SNR $Q_L^0$. In this case, it would be more convenient to take advantage of the long ring-down time and to look for a narrow line in the frequency domain. For a narrow line in the frequency domain one measures $(S(\omega_0)-S(\omega_0 \pm \Delta\omega))$ where $\Delta\omega$ $\omega_0/Q_L$. For such a measurement one would use a band-pass filter identical to optimal detection in conventional magnetic resonance except that the linewidth here is determined by the filtering action of the detection circuit. The optimum SNR $Q_L^0$ here as well. Thus in the limit that amplifier noise dominates, there is no improvement on further increasing $Q_L$.

The actual case will look something like a combination of the two limiting cases discussed above and the optimum filter will look like a band-pass filter with a notch in the middle. The depth of the notch and the width of the bandpass will be determined by the relative sizes of the amplifier and probe noise. The optimized filter computed as discussed above automatically has these optimum characteristics.

In order to explicitly illustrate the effectiveness of super-Q detection, consider the response of the tuned detection circuit to a square excitation at a frequency $\omega_0$ and of duration τ. With $T_Q \equiv 2Q_L/\omega_0$, the measured signal in the time domain will be given approximately by the following Equation 19.

$$s(t) = 0 \qquad\qquad\qquad\qquad t < -\tau$$

$$s(t) = A\sqrt{T_Q}\left(1 - e^{-(t+\tau)/T_Q}\right)e^{i\omega_0 t} \qquad -\tau < t < 0$$

$$s(t) = A\sqrt{T_Q}\left(1 - e^{-\tau/T_Q}\right)e^{i\omega_0 t}e^{-t/T_Q} \quad t > 0$$

where A is an overall scale factor proportional to the amount of sample present. Obtaining $S(\omega)$ from Equation 19 is straight-forward.

The noise power density will then be given by the following Equation 20.

$$P(\omega) = P_0 \frac{1/T_Q^2}{(\omega - \omega_0)^2 + 1/T_Q^2} + P_A(\omega)$$

where $P_0 = P_0(\omega_0)$ is the peak thermal noise power density from the tuned and matched detection circuit, and $P_A$ represents the noise from the amplifier. To keep matters simple at this point, it is assumed that $P_A$ is a constant, though a more detailed analysis should include the frequency dependence of $P_A$, which in turns depends on the particular hardware used. In the white noise case, the minimum noise figure, NF, occurs at $\omega_0$ and is given by $NF \equiv (P_0 + P_A)/P_0$, often expressed in dB. The signal-to-noise ratio after the application of the optimized filter can be calculated using Equation 16 to be as in the following Equations 21 and 22.

$$(SNR)^2 = \frac{1}{2\pi^2} \frac{A^2 \tau^2 Q'}{P_A + P_0}\left[1 - \frac{Q'}{b}\left(1 - e^{-b/Q'}\right)\right]$$

where it is recognized that $T_Q/\tau = Q'/\pi$.

$$b = \pi\sqrt{\frac{P_A + P_0}{P_A}}.$$

FIG. 9 is a diagram illustrating changes in SNR as a function of Q' determined using Equation 21 for a variety of values of NF of the preamplifier, according to an embodiment of the present invention. As can be seen, for Q'<1, there is little improvement in SNR as NF is decreased below 1 dB. However, when Q'>>1, there is still a significant improvement as NF is decreased. The SNR in FIG. 9 is in units indicated by the following Equation 23.

$$\frac{A^2 \tau^2}{\pi P_0} = \left[\left|\frac{d\phi}{dt}\right|^2 \frac{\tau}{\omega_0 L}\right]\left[\frac{1}{4kT}\right]\left[\frac{\omega_0 \tau}{2\pi}\right]$$

$$= \frac{1}{8\pi}\left|\frac{d\phi}{dt}\right|^2 \frac{\tau^2}{kTL}$$

where $d\phi/dt$ represents the EMF induced in the coil, L, by the nuclear magnetization. The brackets in the first form of Equation 23 divide the equation into terms associated with the energy delivered to the coil by the nuclear magnetization during the time τ, the thermal energy in the coil, and a scale factor which relates Q' to $Q_L$ for the specific measurement conditions. The presence of the scale factor means that reducing τ (for example by applying a magnetic field gradient) as a way to increase Q' is not a good strategy for increasing SNR. Note that with all other factors held constant, $|d\phi/dt|$ $L^{1/2}$.

In the limiting cases where Q'<<b and Q'>>b, SNR is given by the following Equation 24.

$$(SNR)^2 = \left[\left|\frac{d\phi}{dt}\right|^2 \frac{\tau}{\omega_0 L}\right]\left[\frac{1}{4kT}\right]\frac{Q_L}{2\pi NF} \qquad Q' \ll b$$

$$= \frac{1}{4}\left[\left|\frac{d\phi}{dt}\right|^2 \frac{\tau}{\omega_0 L}\right]\left[\frac{1}{4kT}\right]\left[\frac{\omega_0 \tau}{2\pi}\right]\sqrt{\frac{1}{NF(NF-1)}} \qquad Q' \gg b.$$

These two equations are very similar in form if one equates $\omega_0\tau/2\pi$ with the "Q of the excitation." The specific results (Equations 23 and 24) are derived for a square excitation of length τ using a white noise model for the amplifier and illustrate the general behavior expected. For the general case, changes of order unity in the numerical factors can be expected.

Conventionally, it was believed that SNR would decreases as Q' increases above 0.3. However, as indicated in FIG. 9, SNR continues to increase as Q' increased beyond 0.3. In fact, SNR continues to increase as Q' increases beyond 1.

Further, FIG. 9 indicates various ranges of Q' where the SNR behaves differently. Referring to FIG. 9, $SNR^2$ is relatively linear as Q' is less than 0.3. As Q' increases from 0.3 to 3, the SNR is still relatively linear, depending on the noise figure. As Q' is greater then 10, the $SNR^2$ begins to flatten out. According to the embodiments of the present invention, Q' can be within any of these ranges, and can theoretically be as high as possible.

Impedance Matching

The probe impedance, $R_0$, can be adjusted over the range $0<R_o<R$ by a suitable choice of L'. In the super-Q limit it is not at all obvious which value will give the best signal-to-noise ratio. In principle, the model equations above (Equations 1, 4, 7, 10, 19) can be used to determine a best value for $R_0$ in a given situation. Since most of the signal occurs at frequencies where the probe impedance is not $R_0$, specific noise characteristics of the amplifier, especially when it is not properly matched, need to be considered in order to choose the best value for $R_0$. In addition, the loaded Q depends on the choice of $R_0$ as well, and will affect correlation times and the measured signal energy. It is, however, reasonable to assume that adjusting $R_0$ to obtain the best amplifier noise figure at (or near) the peak of the signal, S(ω), would be a good strategy.

According to embodiments of the present invention, it is found that in the absence of amplifier noise, SNR continues to increase with increasing Q even in the super-Q limit, where the bandwidth of the tuned detection circuit is smaller than that of the signal to be detected. In the super-Q limit, the maximum obtainable SNR will be limited by noise from the amplifiers in the system. This contrasts with typical magnetic resonance measurements where the ultimate SNR is limited by thermal noise from the detection circuit.

Embodiments of the present invention allow magnetic resonance to be used to detect significantly smaller quantities of certain materials than has been possible previously. In particular, embodiments of the present invention can be applied to the use of Nuclear Quadrupole Resonance (NQR) to the detection of nitrogenous or chlorine-containing explosives or narcotics carried in luggage, mail, small cargo, or on a person. More generally, the above embodiments of the present invention can be used for improved detection of any material which has a magnetic resonance response that is unique compared to its surroundings.

Tank circuits for magnetic resonance using superconducting elements with Q's in the range between 10,000 and 100,000 have been recently reported. However, the only magnetic resonance experiments performed using those circuits were for signals with a comparable or even narrower band response than the detection circuitry.

As discussed above, in some magnetic resonance apparatuses, such as in NQR, it is typical for $Q'\leq 0.3$, and usually Q'<<0.03. However, there are some cases where the condition of Q'=1 is approached. These occur in magnetic resonance imaging with very large field gradients, and in some instances of wideline magnetic resonance spectroscopy. In these cases, the intrinsic magnetic resonance linewidth is greater than the detector (probe) bandwidth. However, since the detector is also used to excite the magnetic resonance signal, the Q of the signal is greater than or equal to the Q of the detector, leading to Q'<=1. Under these conditions, the Q of the detector is fixed, and it is understood that decreasing the Q of the signal until it equals the Q of the detector improves the SNR. By contrast, according to various embodiments of the present invention, the Q of the signal is typically fixed, and the optimal Q of the detector is determined. This implies, for example, that excitation and detection are decoupled. Here, it was not previously known to the magnetic resonance community that the SNR continues to increase as the Q of the detector is increased past the point where the signal is uniformly detected, i.e., 0.3<Q'<1.

According to preferred embodiments of the present invention, Q'>1. However, the embodiments of the present invention are not intended to be limited to Q'>1. For example, as indicated above, conventionally, certain types of magnetic resonance applications, such as NQR, use a limit of Q'<0.3. According to embodiments of the present invention, Q' can be greater than 0.3, to further increase the SNR. Therefore, according to embodiments of the present invention, in NQR, $Q'\geq 0.3$.

The above embodiments of the present invention relate to the Q of a probe. As described herein, a probe has a tank circuit, and the Q of the probe is the Q of the tank circuit. Therefore, the "Q of the probe" and the "Q of the tuned tank circuit of the probe" are used interchangeably herein.

Further, there are many different types of probe configurations which can be used with the embodiments of the present invention. The present invention is not intended to be limited to any specific configuration.

The above embodiments of the present invention are applicable to many different areas of resonance signal detection. For example, the above embodiments of the present invention are applicable to NMR, NQR, broad line NMR studies such as stray field imaging of materials, and possibly to pulsed Electron Paramagnetic Resonance (EPR) spectrometers using high-Q cavities. Therefore, for example, the embodiments of the present invention are applicable to the detection of NMR resonance signals, NQR resonance signals and EPR resonance signals. Moreover, the above embodiments of the present invention are applicable to high-Q magnetic resonance detection schemes such as, for example, the use of small mechanical cantilever beams such as those found in atomic force microscopes.

NQR detection systems for the detection of explosives and narcotics, and various NQR concepts, are disclosed, for example, in U.S. patent titled "DETECTION OF EXPLOSIVE AND NARCOTICS BY LOW POWER LARGE SAMPLE VOLUME NUCLEAR QUADRUPOLE RESONANCE (NQR)", U.S. Pat. No. 5,233,300; U.S. patent titled "REMOVING THE EFFECTS OF ACOUSTIC RINGING AND REDUCING TEMPERATURE EFFECTS IN THE DETECTION OF EXPLOSIVES BY NQR", U.S. Pat. No.

5,365,171; U.S. patent titled "DETECTION OF EXPLOSIVES BY NUCLEAR QUADRUPOLE RESONANCE", U.S. Pat. No. 5,206,592; and U.S. patent titled "METHOD AND APPARATUS FOR DETECTING TARGET SPECIES HAVING QUADRUPOLAR NUCLEI BY STOCHASTIC NUCLEAR QUADRUPOLE RESONANCE", U.S. Pat. No. 5,608,321, which are incorporated herein by reference.

The advantage of "super-Q" detection has been known in detection of gravitational waves, an application far outside magnetic resonance. Applications to gravitational wave detection are discussed in Proceedings of the 2nd ISPRA Nuclear Electronics Symposium, Stresa, Italy, May 1975, page 77, J. L. Levine and R. L. Garwin, "Electronics for the IBM Gravity Wave Detector—Concept, Implementation, and Experience" and more generally in Noise in Electronic Devices and Systems, M. J. Buckingham, (Ellis Horwood Ltd, Chichester, England, 1983), chapter 13, which are incorporated herein by reference.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A resonance apparatus for super-Q detection comprising:

a probe for detecting a resonance signal induced in a sample;

said probe comprising a coil;

wherein said probe forms a tuned tank circuit;

wherein the bandwidth of said probe is narrower than the bandwidth of said resonance signal;

wherein the probe has a $Q_{probe}=f_{probe}/\Delta f_{probe}$, wherein $f_{probe}$ is the resonant frequency of the probe, and $\Delta f_{probe}$ is the full width at half height (FWHH) bandwidth of the probe;

wherein the resonance signal has a $Q_{RS}=f_0/\Delta f_{RS}$, wherein $f_0$ is the center frequency for the resonance signal, and wherein $\Delta f_{RS}$ is the FWHH bandwidth of the signal; and wherein the ratio $Q'=Q_{probe}/Q_{RS}$ is greater than one.

2. An apparatus as in claim 1, wherein Q' is in the range of $1<Q'\leq 3$.

3. An apparatus as in claim 1, wherein Q' is greater than, or equal to, 3.

4. An apparatus as in claim 1, wherein Q' is greater than, or equal to, 10.

5. An apparatus as in claim 1, wherein the probe detects a combined signal which includes the resonance signal and noise, the apparatus further comprising:

a receiver receiving the combined signal from the probe and detecting the resonance signal from the combined signal by integrating the combined signal.

6. An apparatus as in claim 4, wherein the probe detects a combined signal which includes the resonance signal and noise, the apparatus further comprising:

a receiver receiving the combined signal from the probe and detecting the resonance signal from the combined signal by detecting a step increase over time in the power level of the combined signal.

7. An apparatus as in claim 1, wherein the resonance signal is a magnetic resonance signal.

8. An apparatus as in claim 1, wherein the resonance signal is one of the group consisting of a Nuclear Magnetic Resonance (NMR) signal, a Nuclear Quadrupole Resonance (NQR) signal and an Electron Paramagnetic Resonance (EPR) signal.

9. An apparatus as in claim 1, wherein the probe induces the resonance signal in the sample by emitting an RF field towards the sample.

10. A resonance apparatus for super-Q detection comprising:

a probe for detecting a Nuclear Quadrupole Resonance (NQR) signal induced in a sample said probe comprising a coil;

wherein said probe forms a tuned tank circuit;

wherein the band with of said probe is narrower than the bandwidth of said resonance signal;

wherein the probe has a $Q_{probe}=f_{probe}/\Delta f_{probe}$, wherein $f_{probe}$ is the resonant frequency of the probe, and $\Delta f_{probe}$ is the full width at half height (FWHH) bandwidth of the probe;

wherein the resonance signal has a $Q_{RS}=f_0/\Delta f_{RS}$, wherein $f_0$ is the center frequency for the resonance signal, and wherein $\Delta f_{RS}$ is the FWHH bandwidth of the signal; and wherein the ratio $Q'=Q_{probe}/Q_{RS}$ is greater than or equal to 0.3.

11. An apparatus as in claim 10, wherein Q' is in the range of $0.3<Q'\leq 1$.

12. An apparatus as in claim 10, wherein Q' is in the range of $1<Q'\leq 3$.

13. An apparatus as in claim 10, wherein Q' is greater than, or equal to, 1.

14. An apparatus as in claim 10, wherein Q' is greater than, or equal to, 3.

15. An apparatus as in claim 10, wherein Q' is greater than, or equal to, 10.

16. An apparatus as in claim 13, wherein the probe detects a combined signal which includes the NQR signal and noise, the apparatus further comprising:

a receiver receiving the combined signal from the probe and detecting the NQR signal from the combined signal by integrating the combined signal.

17. An apparatus as in claim 15, wherein the probe detects a combined signal which includes the NQR signal and noise, the apparatus further comprising:

a receiver receiving the combined signal from the probe and detecting the NQR signal from the combined signal by detecting a step increase over time in the power level of the combined signal.

18. An apparatus as in claim 10, wherein the probe induces the NQR signal in the sample by emitting an RF field towards the sample.

* * * * *